(12) United States Patent
Shimizu

(10) Patent No.: US 7,521,982 B2
(45) Date of Patent: Apr. 21, 2009

(54) DRIVE CIRCUIT FOR DRIVING POWER DEVICE

(75) Inventor: Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 184 days.

(21) Appl. No.: 11/500,367

(22) Filed: Aug. 8, 2006

(65) Prior Publication Data

US 2007/0210768 A1    Sep. 13, 2007

(30) Foreign Application Priority Data

Mar. 8, 2006    (JP)    ............................. 2006-062934

(51) Int. Cl.
*H03K 17/16*    (2006.01)
(52) U.S. Cl. ..................... 327/388; 327/427; 326/80; 326/27
(58) Field of Classification Search ................. 307/443, 307/572, 575, 475, 296.5, 296.8, 448, 451; 327/112, 311, 381, 388, 427; 326/80, 81, 326/63, 98
See application file for complete search history.

(56) References Cited

U.S. PATENT DOCUMENTS

| 6,774,674 B2 * | 8/2004 | Okamoto et al. .............. 326/80 |
| 2003/0179020 A1 | 9/2003 | Yoshida et al. |

FOREIGN PATENT DOCUMENTS

| DE | 100 26 622 A1 | 6/2001 |
| JP | 2002-314392 | 10/2002 |
| JP | 2003-133927 | 5/2003 |
| JP | 2003-273715 | 9/2003 |
| JP | 2003-324937 | 11/2003 |

* cited by examiner

*Primary Examiner*—Rajnikant B Patel
(74) *Attorney, Agent, or Firm*—Oblon, Spivak, McClelland, Maier & Neustadt, P.C.

(57) ABSTRACT

A drive circuit for driving a power device has a level shift circuit which level-shifts an ON signal and an OFF signal for controlling the power device in ON and OFF states, respectively, and which outputs the level-shifted ON and OFF signals, a mask circuit which stops transmission of the ON and OFF signals when both the ON and OFF signals are lower than a first threshold level, and a short circuit which is provided in a stage before the mask circuit, and which short-circuits a path for transmission of the ON signal and a path for transmission of the OFF signal when both the ON and OFF signals are lower than a second threshold level. The second threshold level is higher than the first threshold level.

7 Claims, 10 Drawing Sheets

DRIVE CIRCUIT FOR DRIVING POWER DEVICE

BACKGROUND OF THE INVENTION

1. Field of the Invention

The present invention relates a drive circuit for driving a power device such as an IGBT or a MOSFET and, more particularly, to a power device drive circuit capable of preventing transmission of an erroneous signal due to negative noise or dv/dt in a high-potential-side reference potential.

2. Background Art

FIG. 11 is a diagram showing a conventional power device drive circuit. This drive circuit includes a level shift circuit 10, a transmission circuit 11 and a driver circuit 12. The level shift circuit 10 has resistors R1 and R2 and high-withstand-voltage NMOS transistors T1 and T2. The transmission circuit 11 has an RS flip-flop 16 and a mask circuit 17. The mask circuit 17 has, as shown in FIG. 2, inverter gates 18 and 19, NAND gates 20 and 21, NOR gates 22 and 23, and an AND gate 24.

An ON signal and an OFF signal for controlling the on/off operations of a power device are input to the level shift circuit 10. The ON and OFF signals are signals in pulse form, which are output from a low-potential-side control circuit 32 and input to the high-withstand-voltage NMOS transistors T1 and T2 of the level shift circuit 10 to be level-shifted to a high potential. The level-shifted ON and OFF signals are transmitted to the power device (not shown) through the transmission circuit 11 and the driver circuit 12.

In ordinary cases, the load on a power device driven by a drive circuit is an inductance load such as a motor and a fluorescent lamp. There is a possibility of the potential of a ground 33 of the drive circuit (high-potential-side reference potential) being changed to the negative side with respect to the potential of a ground 14 at the time of switching due to negative noise or dv/dt in the high-potential-side reference potential under the influence of the inductance load and a parasitic inductance component due to wiring on the printed circuit board.

In such a case, currents flow through the resistors R1 and R2 connected to the ground 33 due to parasitic capacitances and parasitic diodes or the like of the high-withstand-voltage NMOS transistors T1 and T2 to cause voltage drops. The ON and OFF signals are thereby reduced abruptly to cause an erroneous signal, which is transmitted to cause the power device to malfunction.

In order to prevent this malfunction, the mask circuit 17 is provided. The mask circuit 17 stops transmission of the ON and OFF signals to the RS flip-flop 16 when both the ON and OFF signals are lower than a first threshold level (see, for example, Japanese Patent Laid-Open 2003-273715).

A situation where the outputs from the level shift circuit 10, i.e., the ON and OFF signals, are abruptly lowered due to the influence of dv/dt for example, as shown in (a) of FIG. 12, will be considered. In (a) of FIG. 12, the threshold level (first threshold level) of inverter gates 18 and 19 of the mask circuit 17 is indicated by broken line A. The output signals from the inverter gates 18 and 19 of the mask circuit 17 and the output signal from the AND gate 24 change as shown in (b) to (d), respectively, of FIG. 12.

If a potential difference occurs between the ON and OFF signals due to variation in the parasitic capacitances of the high-withstand-voltage NMOS transistors T1 and T2, the range in which the output signal from the AND gate is active (high) is narrower than the range in which the output signal from the inverter gate 18 or 19 is active (high). There is, therefore, a problem that an erroneous signal is transmitted from the NOR gate 22 on the On side to the RS flip-flop 16, as shown in (e) of FIG. 12.

SUMMARY OF THE INVENTION

In view of the above-described problems, an object of the present invention is to provide a power device drive circuit capable of preventing transmission of an erroneous signal due to negative noise or dv/dt in a high-potential-side reference potential.

According to one aspect of the present invention, a drive circuit for driving a power device has a level shift circuit which level-shifts an ON signal and an OFF signal for controlling the power device in ON and OFF states, respectively, and which outputs the level-shifted ON and OFF signals, a mask circuit which stops transmission of the ON and OFF signals when both the ON and OFF signals are lower than a first threshold level, and a short circuit which is provided in a stage before the mask circuit, and which short-circuits a path for transmission of the ON signal and a path for transmission of the OFF signal when both the ON and OFF signals are lower than a second threshold level. The second threshold level is higher than the first threshold level.

The present invention enables prevention of transmission of an erroneous signal due to negative noise or dv/dt in a high-potential-side reference potential.

Other and further objects, features and advantages of the invention will appear more fully from the following description.

DETAILED DESCRIPTION OF THE PREFERRED EMBODIMENTS

First Embodiment

Figure 1:
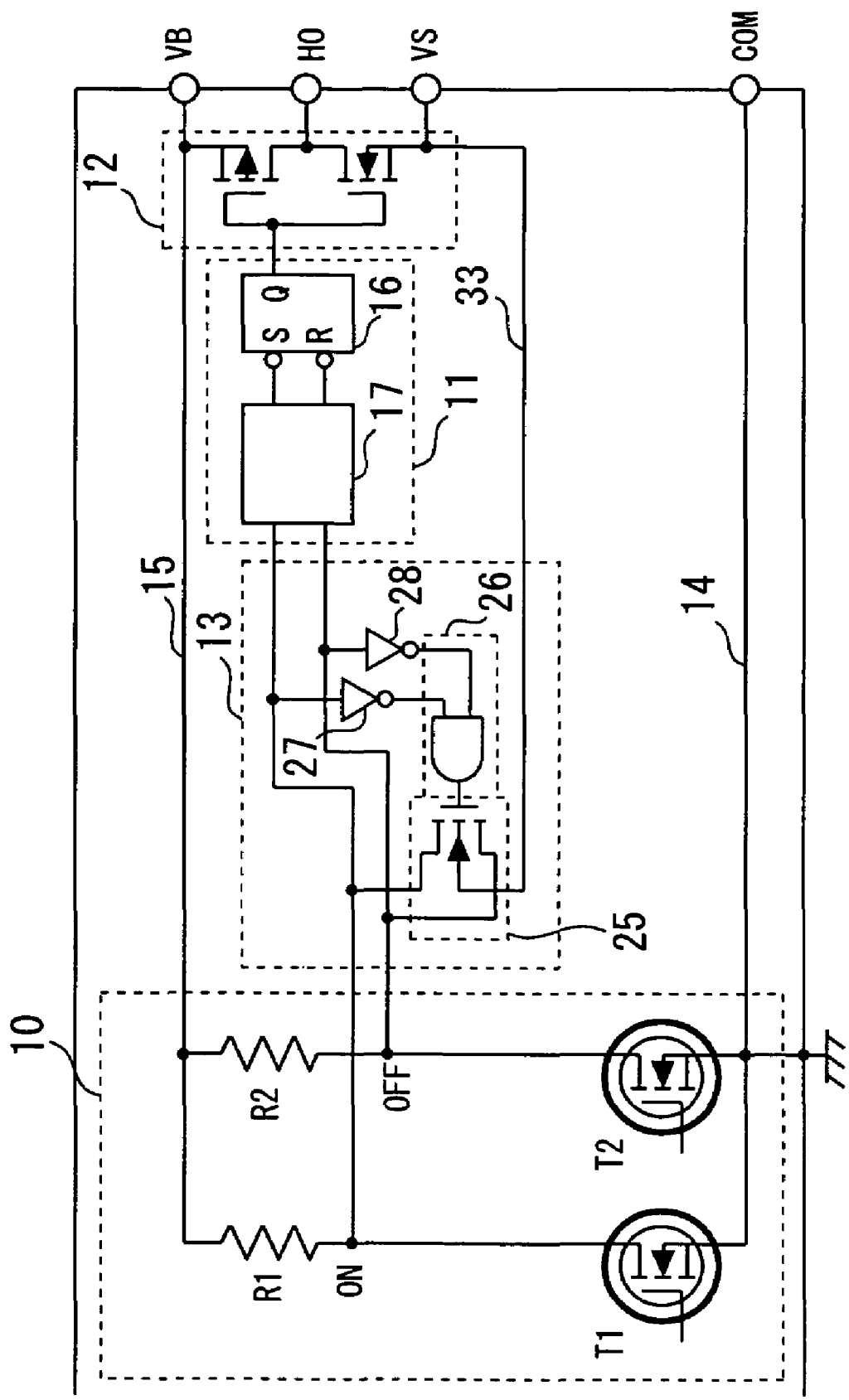
FIG. 1 is a diagram showing a power device drive circuit according to a first embodiment of the present invention.

FIG. 1 is a diagram showing a power device drive circuit according to a first embodiment of the present invention. This drive circuit is a circuit for generating a signal for driving a power device. This drive circuit has a level shift circuit 10, a transmission circuit 11, a driver circuit 12 and a short circuit 13. This drive circuit is implemented as a high-withstand-voltage integrated circuit (HVIC).

The level shift circuit 10 has resistors R1 and R2 and high-withstand-voltage NMOS transistors T1 and T2. Each of the sources of the transistors T1 and T2 is connected to a ground 14, and each of the drains of the transistors T1 and T2 is connected to a high-potential-side power source 15 through the resistor R1 or R2. Low-potential ON and OFF signals for controlling the on/off operation of the power device are input to the gates of the transistors T1 and T2. The transistors T1 and T2 are operated by these signals to produce potential difference across the resistors R1 and R2. The ON and OFF signals are thereby level-shifted to a high potential before being output from the drain sides of the transistors T1 and T2.

Figure 2:
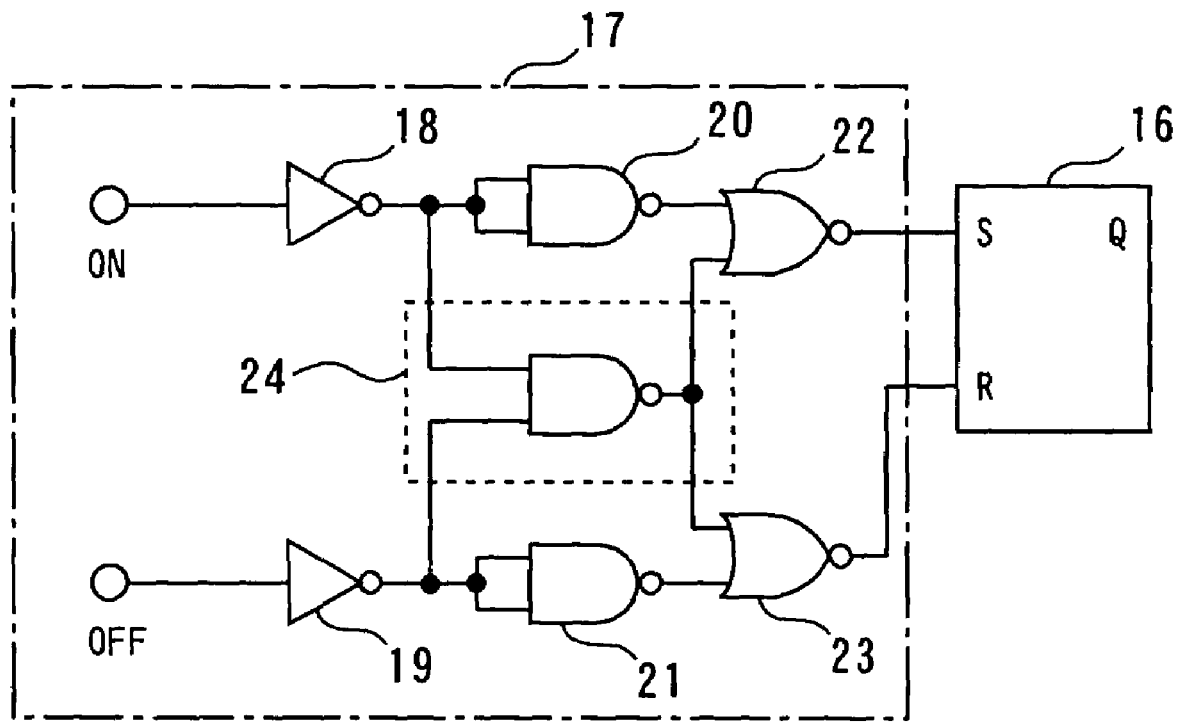
FIG. 2 is a diagram showing a mask circuit.

The transmission circuit 11 has an RS flip-flop 16 and a mask circuit 17. The mask circuit 17 has, as shown in FIG. 2, inverter gates 18 and 19, NAND gates 20 and 21, NOR gates 22 and 23, and an AND gate 24.

The level-shifted ON and OFF signals are input to the inverter gates 18 and 19, respectively, of the mask circuit 17. The inverter gates 18 and 19 perform logical inversion at a first threshold level. Outputs from the inverter gates 18 and 19 are input to the NOR gates 22 and 23 via the NAND gates 20 and 21. The outputs from the inverter gates 18 and 19 are also input to the AND gate 24, and an output from the AND gate 24 is input to the NOR gates 22 and 23. The AND gate 24 generates a mask signal for performing masking so that the outputs from the inverter gates 18 and 19, i.e., the ON and OFF signals, are not transmitted to the RS flip-flop 16 when both the outputs from the inverter gates 18 and 19 are active. Thus, the mask circuit 17 stops transmission of the ON and OFF signals when both the ON and OFF signals are lower than the first threshold level.

An output from the NOR gate 22 of the mask circuit 17 is input to a setting input terminal S of the RS flip-flop 16, while an output from the NOR gate 23 is input to a resetting input terminal R of the RS flip-flop 16. An output from the RS flip-flop 16 is transmitted to the power device (not shown) via the driver circuit 12.

In the present invention, a short circuit 13 is provided in a stage before the mask circuit 17. The short circuit 13 has an NMOS transistor 25, an AND gate 26, and inverter gates 27 and 28. The inverter gates 27 and 28 perform logical inversion at a second threshold level. The source and drain of the NMOS transistor 25 are connected in the ON signal transmission path (between the drain terminal of the transistor T1 and the inverter gate 18) and in the OFF signal transmission path (between the drain terminal of the transistor T2 and the inverter gate 19), respectively. The AND gate 26 is supplied with the ON and OFF signals via the inverter gates 27 and 28 and produces an output to the gate of the NMOS transistor 25. The thus-formed short circuit 13 short-circuits the ON signal transmission path and the OFF signal transmission path when both the ON and OFF signals are lower than the second threshold level.

The second threshold level is set higher than the first threshold level to enable the short circuit 13 to operate before the operation of the transmission circuit 11.

Figure 3:
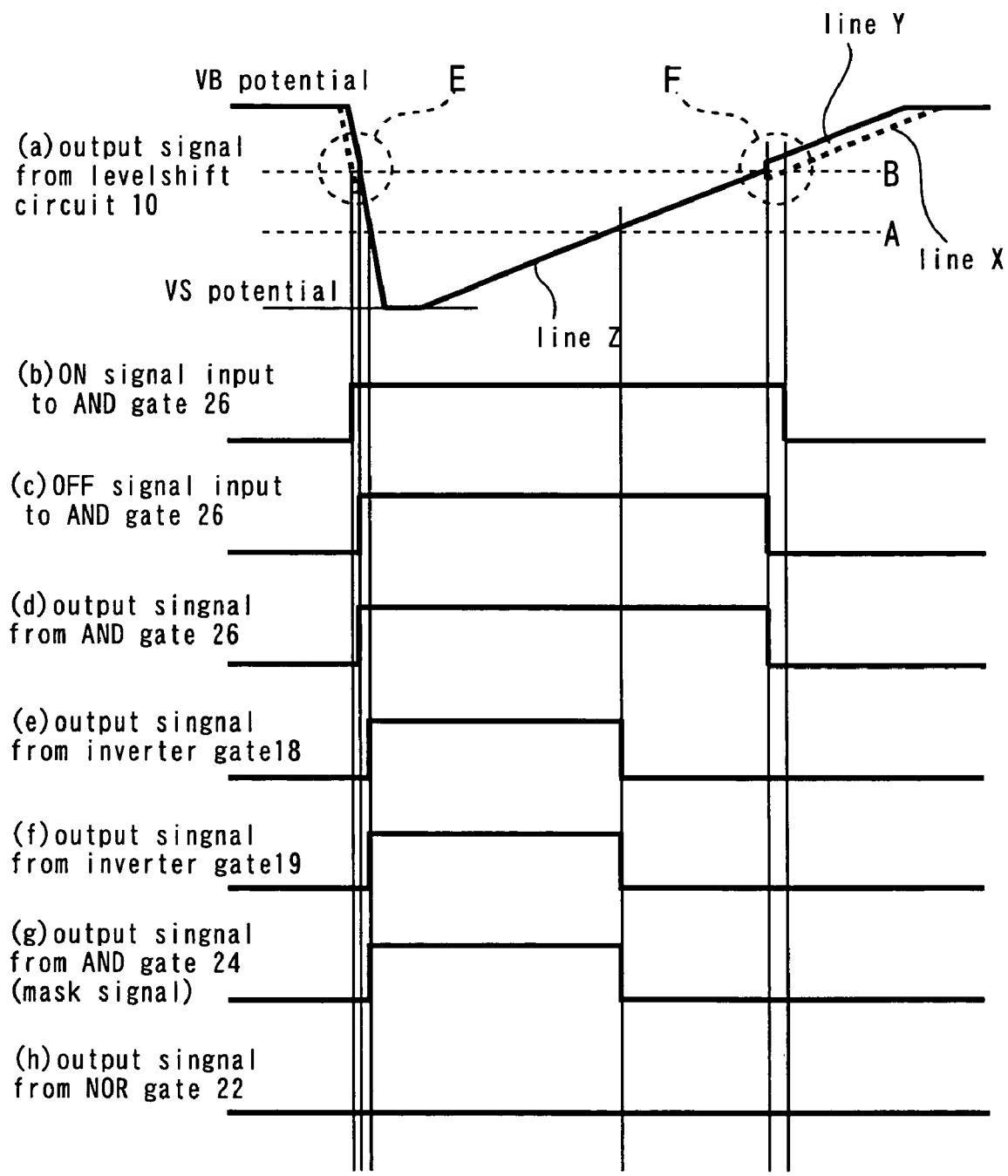
FIG. 3 is a timing chart of the drive circuit shown in FIG. 1.
Figure 4:
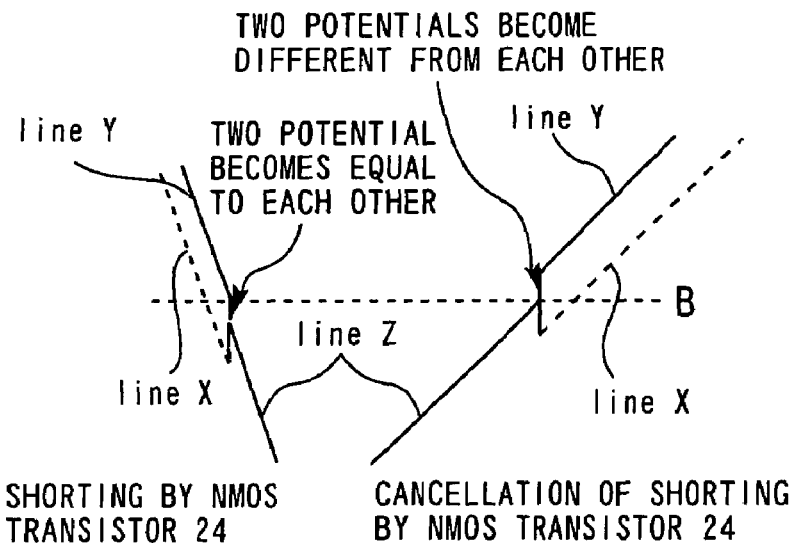
FIG. 4 is an enlarged diagram showing an essential portion of (a) of FIG. 3.

A situation where the outputs from the level shift circuit 10, i.e., the ON and OFF signals, are abruptly lowered due to the influence of dv/dt for example, as shown in (a) of FIG. 3, will be considered. In (a) of FIG. 3, the first threshold level is indicated by broken line A; the second threshold level by broken line B; the ON signal by line X; and the OFF signal by line Y. FIG. 4 is an enlarged view of an essential portion of (a) of FIG. 3.

If the OFF signal is higher than the ON signal, the inverter gate 27 supplied with the ON signal reaches the second threshold level for logical inversion earlier than the inverter gate 28 supplied with the OFF signal. Accordingly, the ON signal is input to the AND gate 26 earlier than the OFF signal, as shown in (b) and (c) of FIG. 3.

When a condition is established in which both the ON and OFF signals are equal to the second threshold level for logical inversion of the inverter gates 27 and 28, a signal is output from the AND gate 26, as shown in (d) of FIG. 3. The gate of the NMOS transistor 25 is thereby turned on to short-circuit the ON signal transmission path and the OFF signal transmission path. This state corresponds to point E in (a) of FIG. 3.

The potential difference between the ON signal and the OFF signal is eliminated by this shorting operation, so that line X (ON signal) and line Y (OFF signal) are superposed one on another to form ideal line Z. When the ON and OFF signals reach the first threshold level of the inverter gates 18 and 19 of the transmission circuit 11 as a result of the increase in voltage drop of the ON and OFF signals, signals are simultaneously output from the inverter gates 18 and 19, as shown in (e) and (f) of FIG. 3. Simultaneously, an output signal (mask signal) is also output from the AND gate 24, as shown in (g) of FIG. 3. Therefore, no erroneous signal is output from the NOR gate 22 when the signal from the AND gate 24 rises, as shown in (h) of FIG. 3.

When the ON and OFF signals thereafter exceed the first threshold level of the inverter gates 18 and 19 of the transmission circuit 11 as a result of rise from VS potential, the output signals from the inverter gates 18 and 19 of the transmission circuit 11 become off simultaneously, as shown in (e) and (f) of FIG. 3. Simultaneously, the output signal (mask signal) from the AND gate 24 becomes off, as shown in (g) of FIG. 3. Therefore, no erroneous signal is output from the NOR gate 22 when the signal from the AND gate 24 falls, as shown in (h) of FIG. 3.

When the ON and OFF signals thereafter exceed the second threshold level of the inverter gates 27 and 28 of the short circuit 13, the signal from the AND gate 26 for turning on the gate of the NMOS transistor 25 becomes off to turn off the NMOS transistor 25, as shown in (d) of FIG. 3. As a result, the ON signal transmission path and the OFF signal transmission path are again insulated electrically. This state corresponds to point F in (a) of FIG. 3. By this operation, line Z is again separated into line X (ON signal) and line Y (OFF signal), as shown in FIG. 4. Immediately after this separation, one of the ON and OFF signals is higher than the second threshold level and, therefore, no signal is output from the AND gate 26.

In the drive circuit in this embodiment, as described above, the ideal condition in which there is no potential difference between the ON and OFF signals input to the mask circuit 17 is established before the ON and OFF signals reach the potential at which an erroneous signal is masked by the mask circuit 17, thus reliably preventing transmission of an erroneous signal from the mask circuit 17 to the RS flip-flop 16. However, there is a need to set a difference between the first threshold level and the second threshold level such that the short circuit 13 operates earlier than the transmission circuit 11 even when the potential difference ΔV between the ON and OFF signals is increased.

Figure 5:
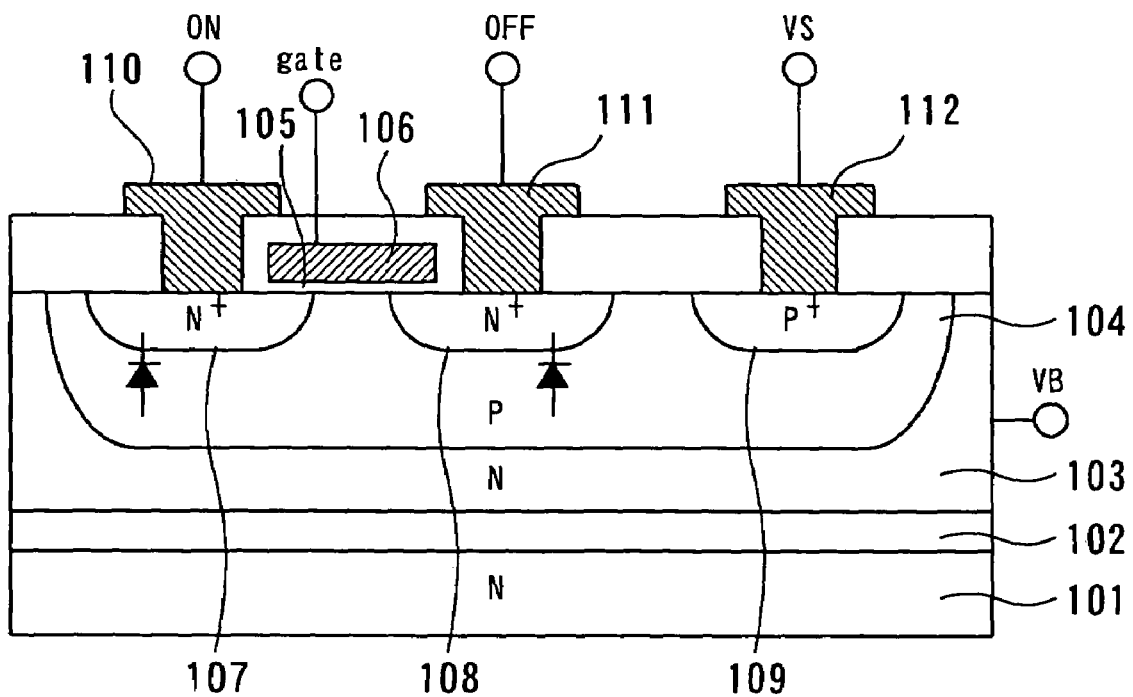
FIG. 5 is a sectional view showing an NMOS transistor in a short circuit.
Figure 11:
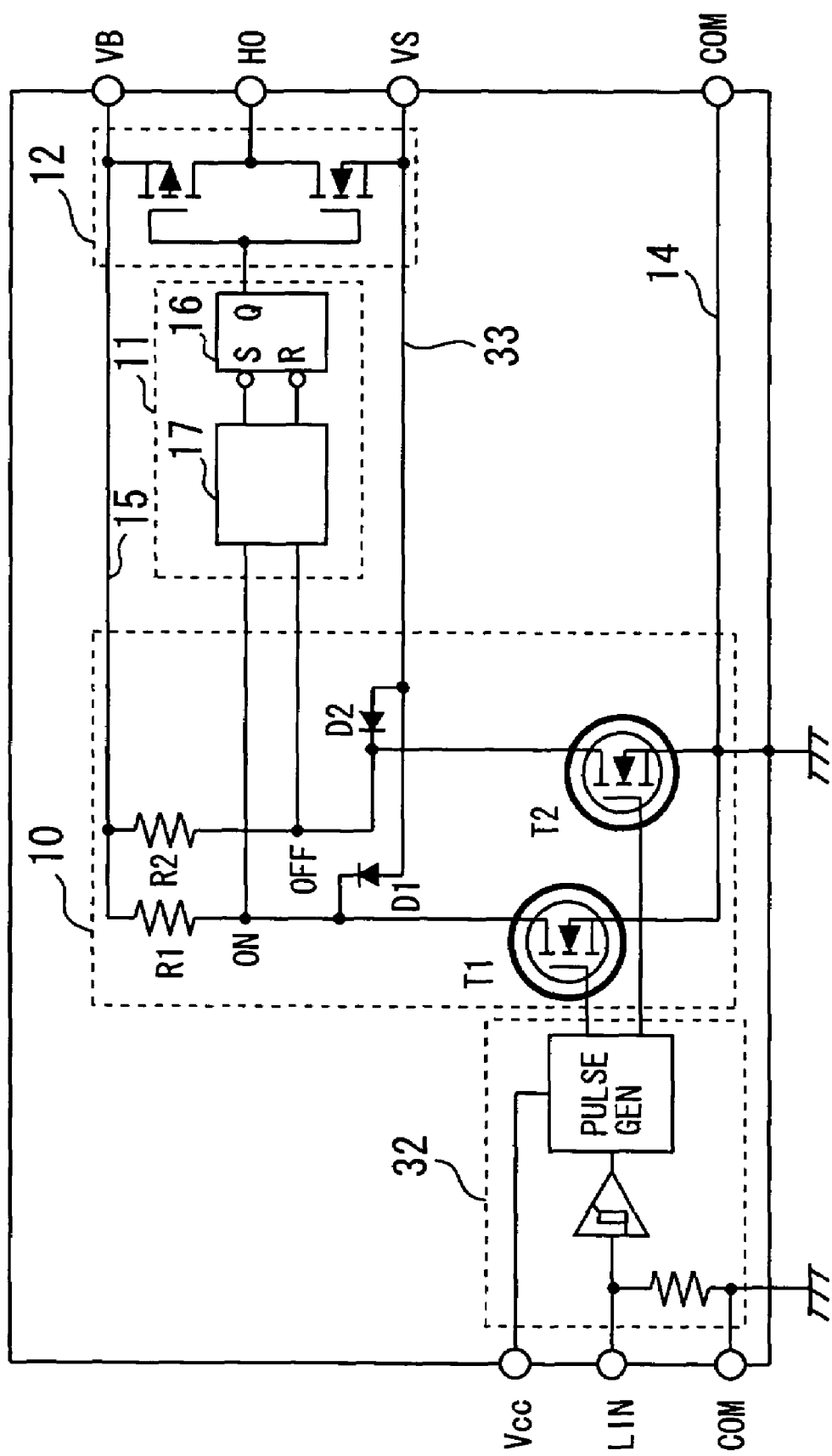
FIG. 11 is a diagram showing a conventional power device drive circuit.
Figure 12:
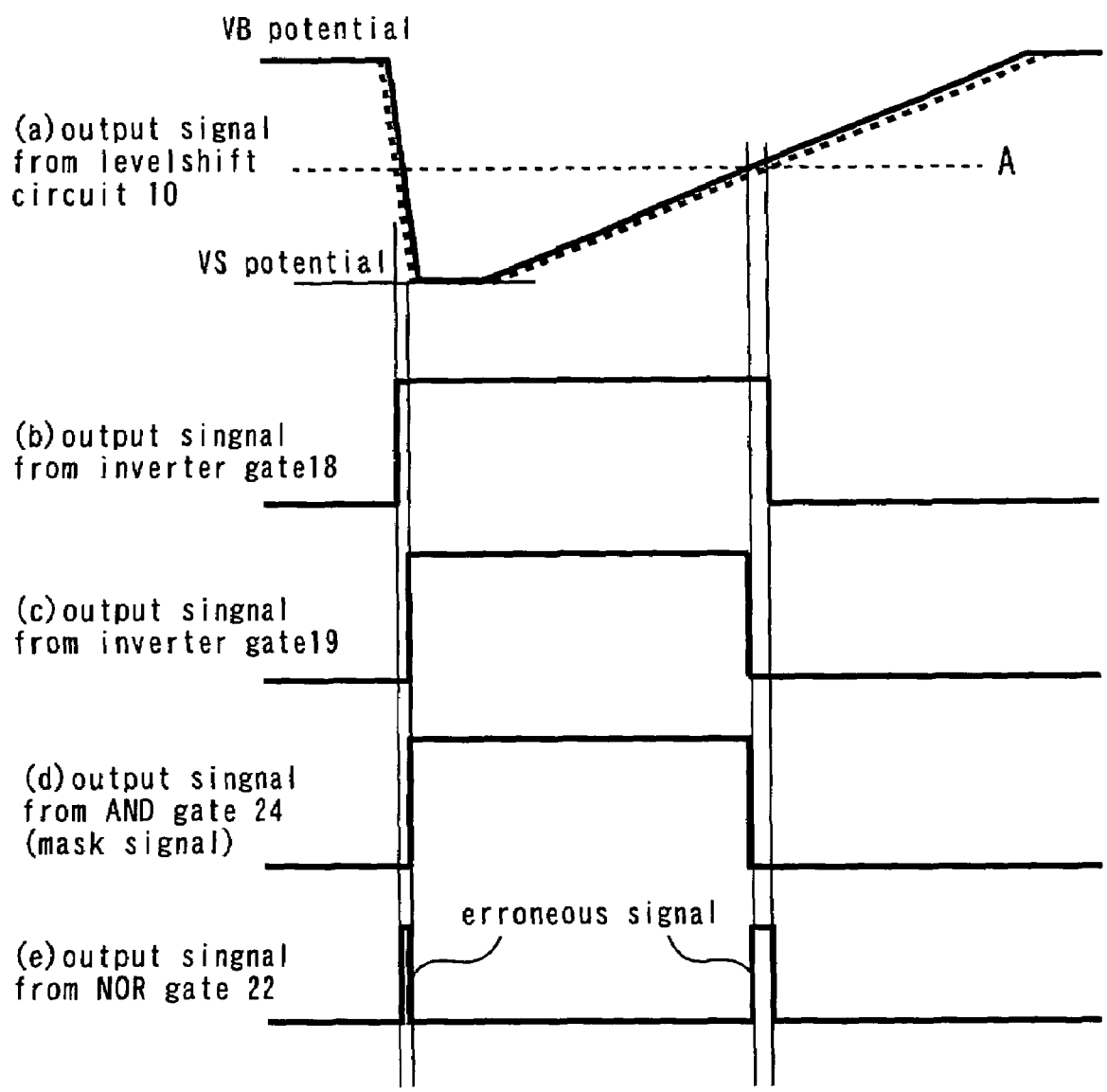
FIG. 12 is a timing chart of the drive circuit shown in FIG. 11.

FIG. 5 is a sectional view of the NMOS transistor 25. A buried oxide film 102, an $N^-$ epitaxial layer 103 and a P-well 104 are formed in this order on an N-type semiconductor substrate 101. Gate polysilicon 106 is formed on the P-well 104, with an oxide film 105 interposed therebetween. $N^+$ diffusion layers 107 and 108 are respectively provided in the P-well 104 on opposite sides of the gate polysilicon 106. A $P^+$ diffusion layer 109 is provided in the P-well 104 by being spaced apart from the $N^+$ diffusion layers 107 and 108. Aluminum electrodes 110, 111, and 112 are connected to the $N^+$ diffusion layers 107 and 108 and the P+ diffusion layer 109, respectively. The ON and OFF signals are input through the aluminum electrodes 110 and 111, respectively. VS potential is applied to the aluminum electrode 112, while VB potential is applied to the N− epitaxial layer 103 provided as a back gate. When the ON and OFF signals become equal to or lower than VS potential, a parasitic diode formed by the N+ diffusion layers 107 and 108 and the P-well 104 is forwardly biased. The drains of the transistors T1 and T2 of the level shift circuit 10 are thereby clamped to VS potential. This arrangement has the same function as that of the clamp diodes D1 and D2 in the conventional circuit shown in FIG. 11. Therefore the need for the clamp diodes D1 and D2 can be eliminated by introducing the NMOS transistor 25.

Second Embodiment

Figure 6:
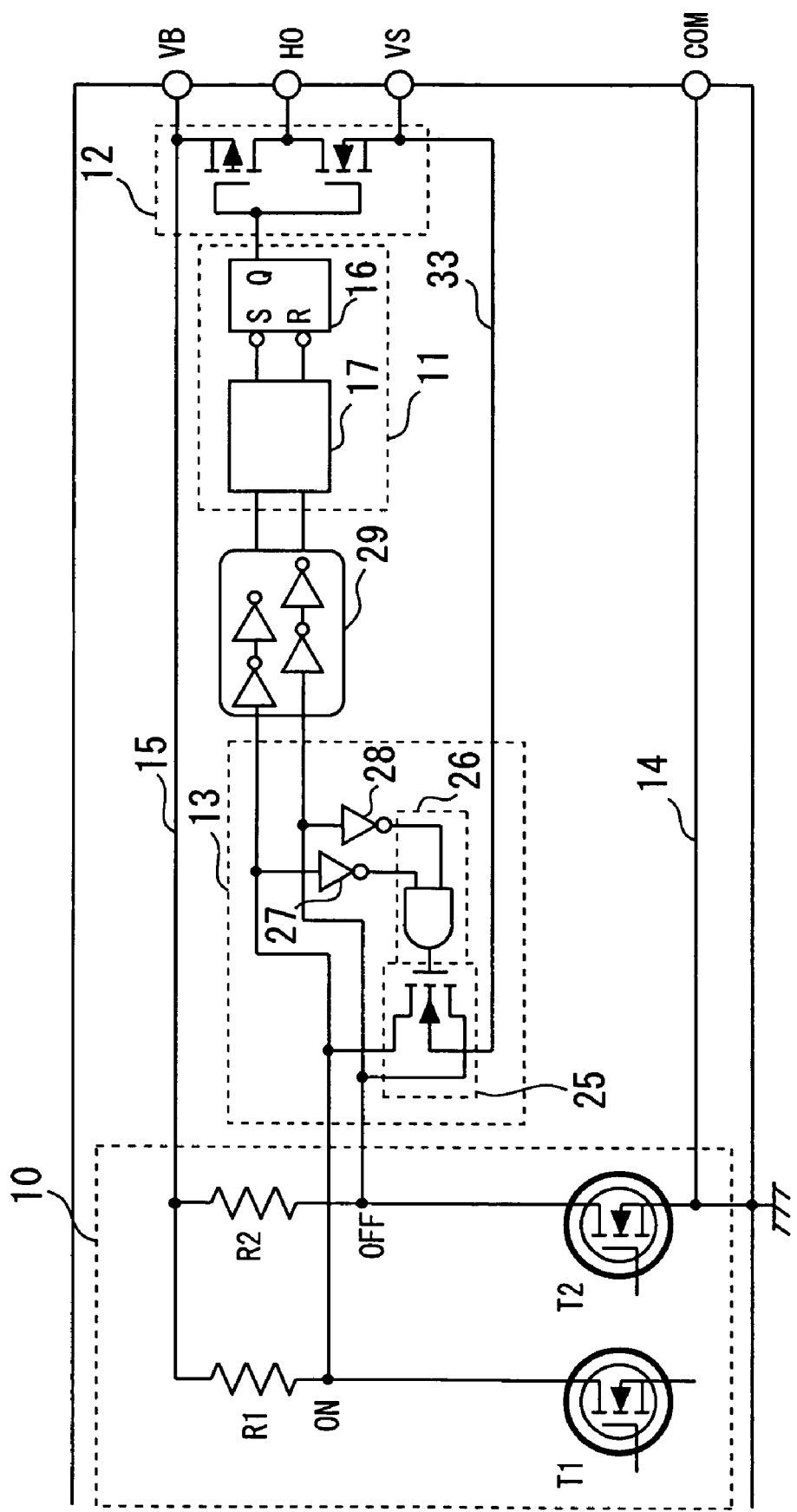
FIG. 6 is a diagram showing a power device drive circuit according to a second embodiment of the present invention.

FIG. 6 is a diagram showing a power device drive circuit according to a second embodiment of the present invention. This drive circuit further includes a delay circuit 29 provided between the short circuit 13 and the mask circuit 17. In other respects, the configuration of the second embodiment is the same as that of the first embodiment.

Figure 7:
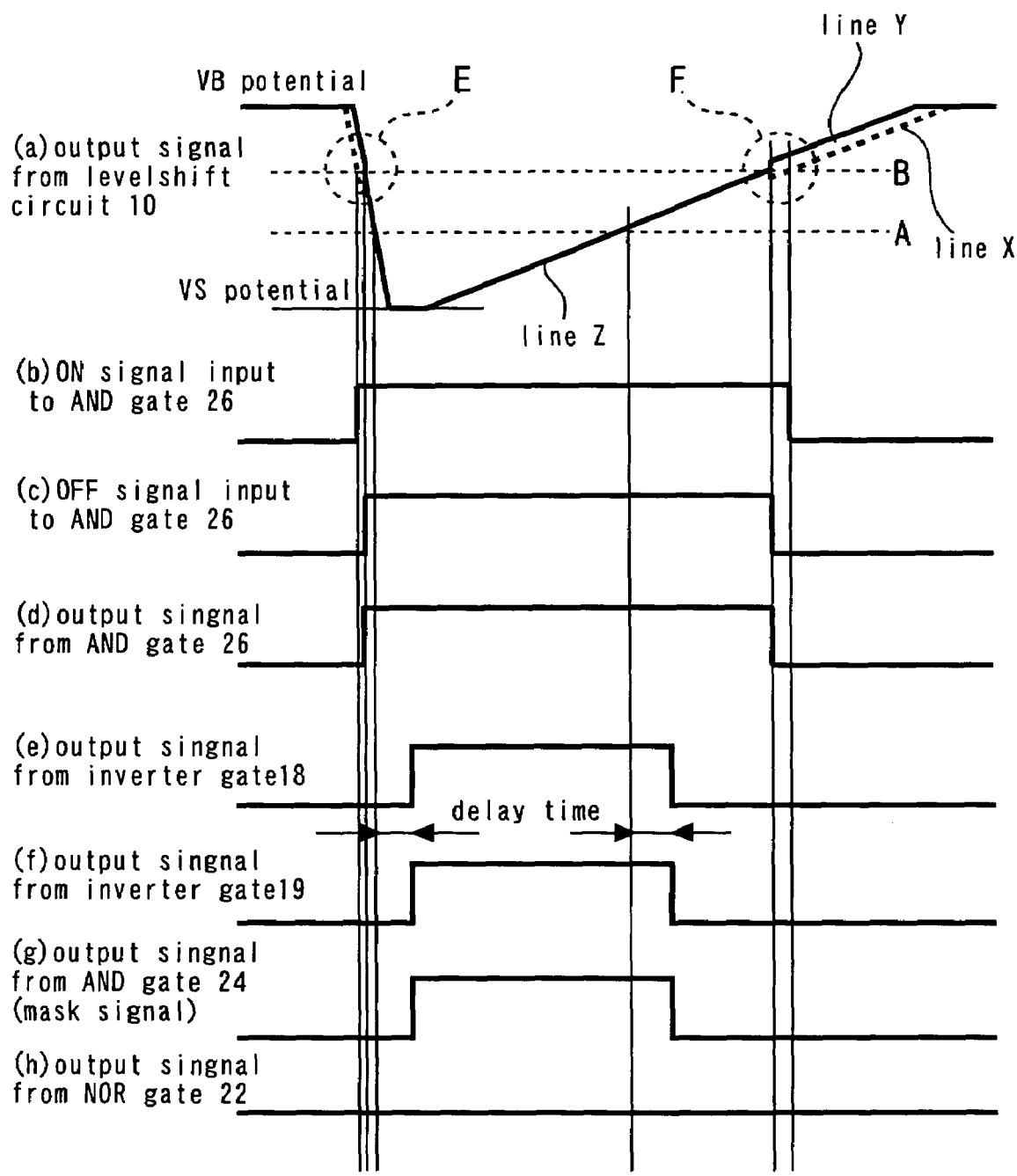
FIG. 7 is a timing chart of the drive circuit shown in FIG. 6.

In ordinary cases, an erroneous signal due to dv/dt for example falls steeply and rises moderately, as shown in (a) of FIG. 7. Therefore the delay circuit 29 is provided to input the signals to the transmission circuit 11 after the short circuit 13 has operated reliably, as shown in (e) and (f) of FIG. 7. A malfunction due to an abrupt change at the time of falling can be prevented with reliability in this way. However, it is desirable that the delay time set by the delay circuit 29 be shorter than the minimum pulse width with which an erroneous signal is transmitted in the transmission circuit 11.

Third Embodiment

Figure 8:
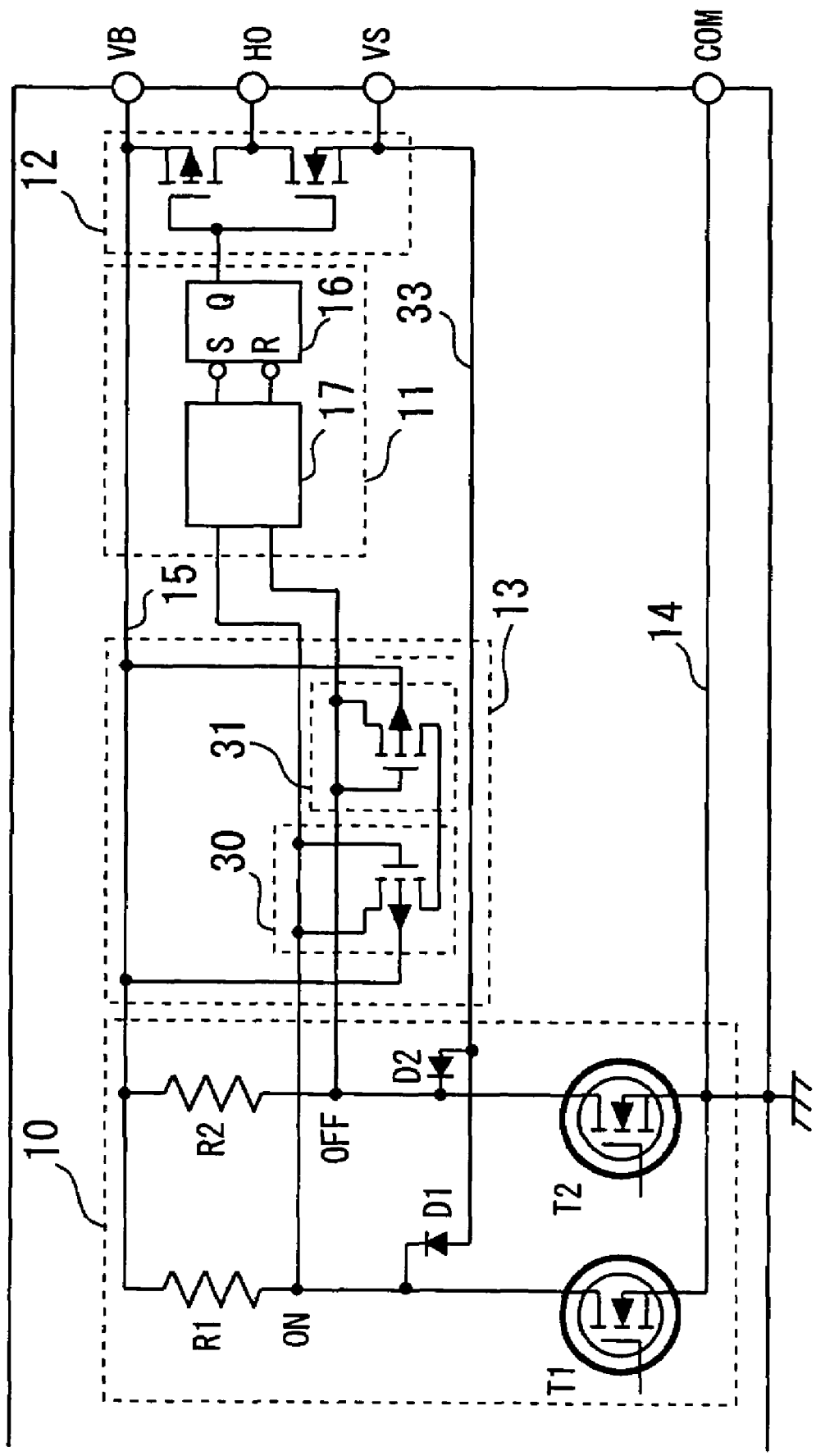
FIG. 8 is a diagram showing a power device drive circuit according to a third embodiment of the present invention.

FIG. 8 is a diagram showing a power device drive circuit according to a third embodiment of the present invention. The configuration of the short circuit 13 in this drive circuit differs from that in the first embodiment. In other respects, the configuration of the third embodiment is the same as that of the first embodiment.

The short circuit 13 has a first PMOS transistor 30 having its drain and gate connected to the ON signal transmission path, and a second PMOS transistor 31 having its drain and gate connected to the OFF signal transmission path and its source connected to the source of the PMOS transistor 30.

Figure 9:
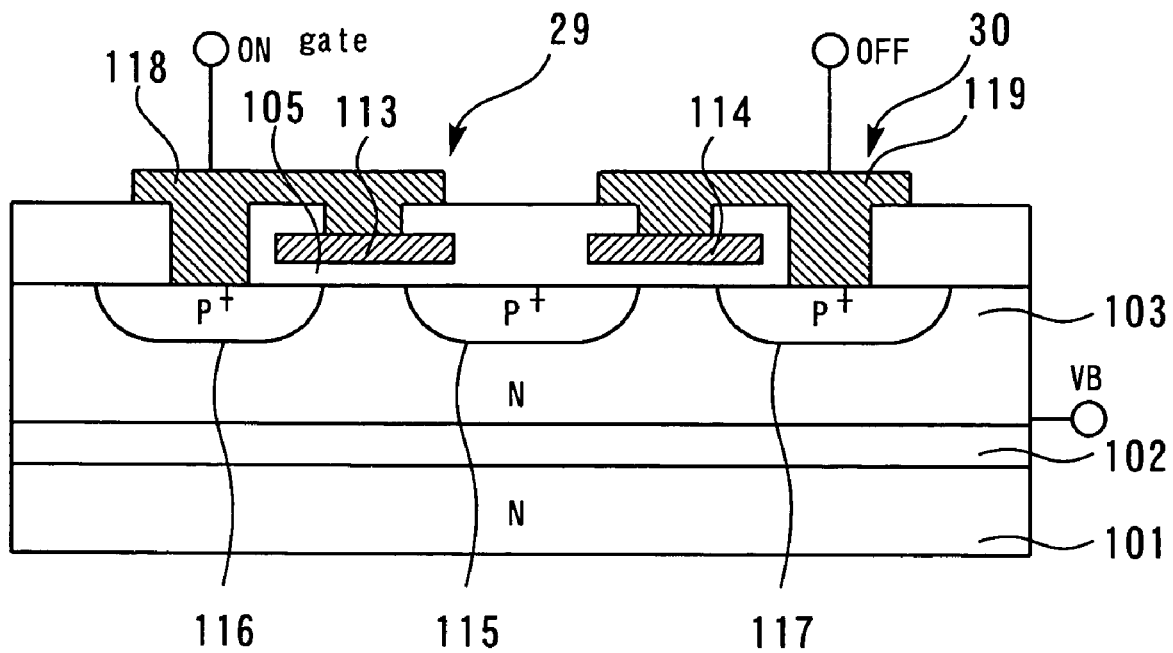
FIG. 9 is a sectional view showing two PMOS transistors of a short circuit.

FIG. 9 shows a sectional view showing the first PMOS transistor 30 and the second PMOS transistor 31. A buried oxide film 102 and an N− epitaxial layer 103 are formed in this order on an N-type semiconductor substrate 101. Gate polysilicon 113 and gate polysilicon 114 are formed on the N− epitaxial layer 103, with an oxide film 105 interposed therebetween. A P+ diffusion layer 115 is provided as the sources of the two transistors in the N− epitaxial layer 103 between the gate polysilicon 113 and the gate polysilicon 114. A P+ diffusion layer 116 is provided as the drain of the first PMOS transistor 30 in the N− epitaxial layer 103 opposite from the gate polysilicon 113. A P+ diffusion layer 117 is provided as the drain of the second PMOS transistor 31 in the N− epitaxial layer 103 opposite from the gate polysilicon 114. An aluminum electrode 118 is connected to the gate polysilicon 113 and the P+ diffusion layer 116. An aluminum electrode 119 is connected to the gate polysilicon 114 and the P+ diffusion layer 117. The ON and OFF signals are input through the aluminum electrodes 117 and 119. VB potential is applied to the N− epitaxial layer 103 provided as a back gate.

Figure 10:
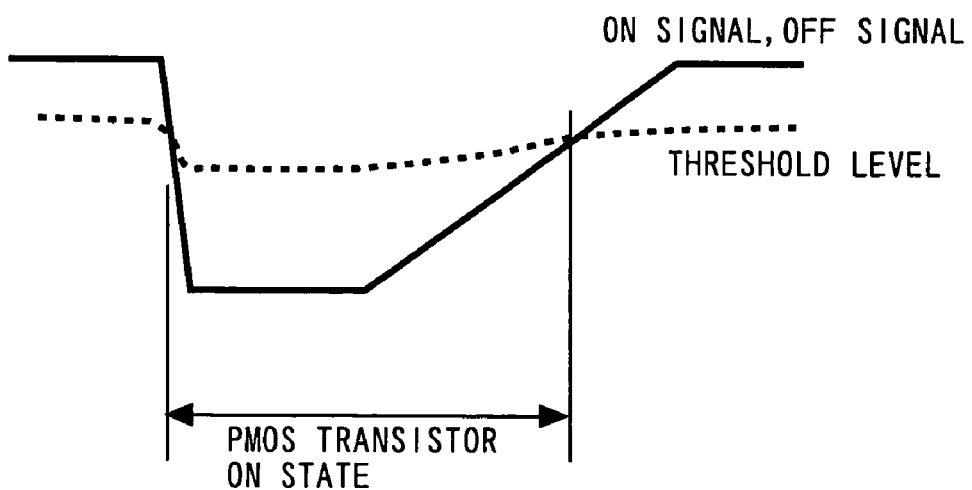
FIG. 10 is a diagram showing the operation of the PMOS transistors of the short circuit.

The operation of the PMOS transistors 30 and 31 in this short circuit 13 will be described with reference to FIG. 10, in which the solid line indicates changes in the ON and OFF signals and the broken line indicates the threshold level of the PMOS transistors 30 and 31. When the ON and OFF signals become lower than the VB potential due to the influence of dv/dt for example, the potentials on the gates and drains of the PMOS transistors 30 and 31 connected in the transmission paths are reduced to automatically turn on the PMOS transistors 30 and 31. Both the PMOS transistors 30 and 31 on the ON and OFF sides are turned on to short-circuit the ON signal transmission path and the OFF signal transmission path. A reduction in the level indicated by broken line c representing the threshold level of the PMOS transistors 30 and 31 accompanies a change in the ON and OFF signals because the potentials on the sources and drains of the PMOS transistors 30 and 31 are affected by the back gate bias effect apparently increased and reduced with respect to the back gate.

In this embodiment, the PMOS transistors 30 and 31 are automatically turned on/off as the potentials of the ON and OFF signals change. Thus, the effect of eliminating the need for a drive device is achieved as well as the same effects as those of the first embodiment. The short circuit can therefore be configured extremely simply.

A delay circuit 29 may be provided between the short circuit 13 and the mask circuit 17, as in the second embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-062934, filed on Mar. 8, 2006 including specification, claims, drawings and summary, on which the Convention priority of the present application is based, are incorporated herein by reference in its entirety.

What is claimed is:

1. A drive circuit for driving a power device, comprising:
   a level shift circuit which level-shifts an ON signal and an OFF signal for controlling the power device in ON and OFF states, respectively, and which outputs the level-shifted ON and OFF signals;
   a mask circuit which stops transmission of the ON and OFF signals when both the ON and OFF signals are lower than a first threshold level; and
   a short circuit which is provided in a stage before the mask circuit, and which short-circuits a path for transmission of the ON signal and a path for transmission of the OFF signal when both the ON and OFF signals are lower than a second threshold level,
   wherein the second threshold level is higher than the first threshold level.

2. The drive circuit for driving a power device according to claim 1, wherein the short circuit includes:
   an NMOS transistor having its source and drain connected to the ON signal transmission path and the OFF signal transmission path, respectively; and
   an AND gate to which the ON and OFF signals are input through inverter gates, and which produces an output to the gate of the NMOS transistor.

3. The drive circuit for driving a power device according to claim 1, wherein the short circuit includes:
   a first PMOS transistor having its drain and gate connected to the ON signal transmission path; and a second PMOS transistor having its drain and gate connected to the OFF signal transmission path and its source connected to the source of the first PMOS transistor.

4. The drive circuit for driving a power device according to claim 1, further comprising a delay circuit provided between the short circuit and the mask circuit.

5. The drive circuit for driving a power device according to claim 2, further comprising a delay circuit provided between the short circuit and the mask circuit.

6. The drive circuit for driving a power device according to claim 3, further comprising a delay circuit provided between the short circuit and the mask circuit.

7. A drive circuit for driving a power device, comprising:
a level shift circuit configured to level-shift an ON signal and an OFF signal to control the power device in ON and OFF states, respectively, and to output the level-shifted ON and OFF signals;

a mask circuit configured to stop transmission of the ON and OFF signals when both the ON and OFF signals are lower than a first threshold level; and means, provided in a stage before the mask circuit, for short-circuiting a path for transmission of the ON signal and a path for transmission of the OFF signal when both the ON and OFF signals are lower than a second threshold level, wherein the second threshold level is higher than the first threshold level.

* * * * *